United States Patent [19]

Pang

[11] Patent Number: 5,307,382
[45] Date of Patent: Apr. 26, 1994

[54] LOCK APPARATUS FOR DUAL PHASE LOCKED LOOP

[75] Inventor: Dai S. Pang, Seoul, Rep. of Korea

[73] Assignee: Goldstar Electron Co., Ltd., Choongchungbook, Rep. of Korea

[21] Appl. No.: 880,774

[22] Filed: May 11, 1992

[30] Foreign Application Priority Data

May 15, 1991 [KR] Rep. of Korea ................ 7868/1991

[51] Int. Cl.$^5$ ............................................. H03D 3/24
[52] U.S. Cl. .................................... 375/120; 375/119
[58] Field of Search .................... 375/7, 8, 119, 120

[56] References Cited

U.S. PATENT DOCUMENTS 4,689,806  8/1987  Von der Embre ............. 375/119 X

Primary Examiner—Curtis Kuntz
Assistant Examiner—Paul Loomis
Attorney, Agent, or Firm—Lowe, Price, LeBlanc & Becker

[57] ABSTRACT

Lock apparatus for a dual PLL which is capable of detecting a locked state of a receiving frequency as well as a locked state of a transmitting frequency. The dual PLL lock apparatus comprises a receive lock detector for detecting the phase locked state of the receiving frequency in response to a locked state signal from a receiving phase difference detector, in addition to the conventional dual PLL lock apparatus which can lock the transmitting and receiving frequencies, respectively, and detect the locked state of the transmitting frequency. The receive lock detector comprises a reset signal generating circuit for generating a reset signal in response to the receive locked state signal from the receiving phase difference detector, a frequency-dividing circuit for dividing a predetermined frequency from the reference frequency counter by a given ratio in response to the reset signal from the reset signal generating circuit, and a receive lock data output circuit for outputting receive lock data in response to an output signal from the frequency-dividing circuit.

5 Claims, 4 Drawing Sheets

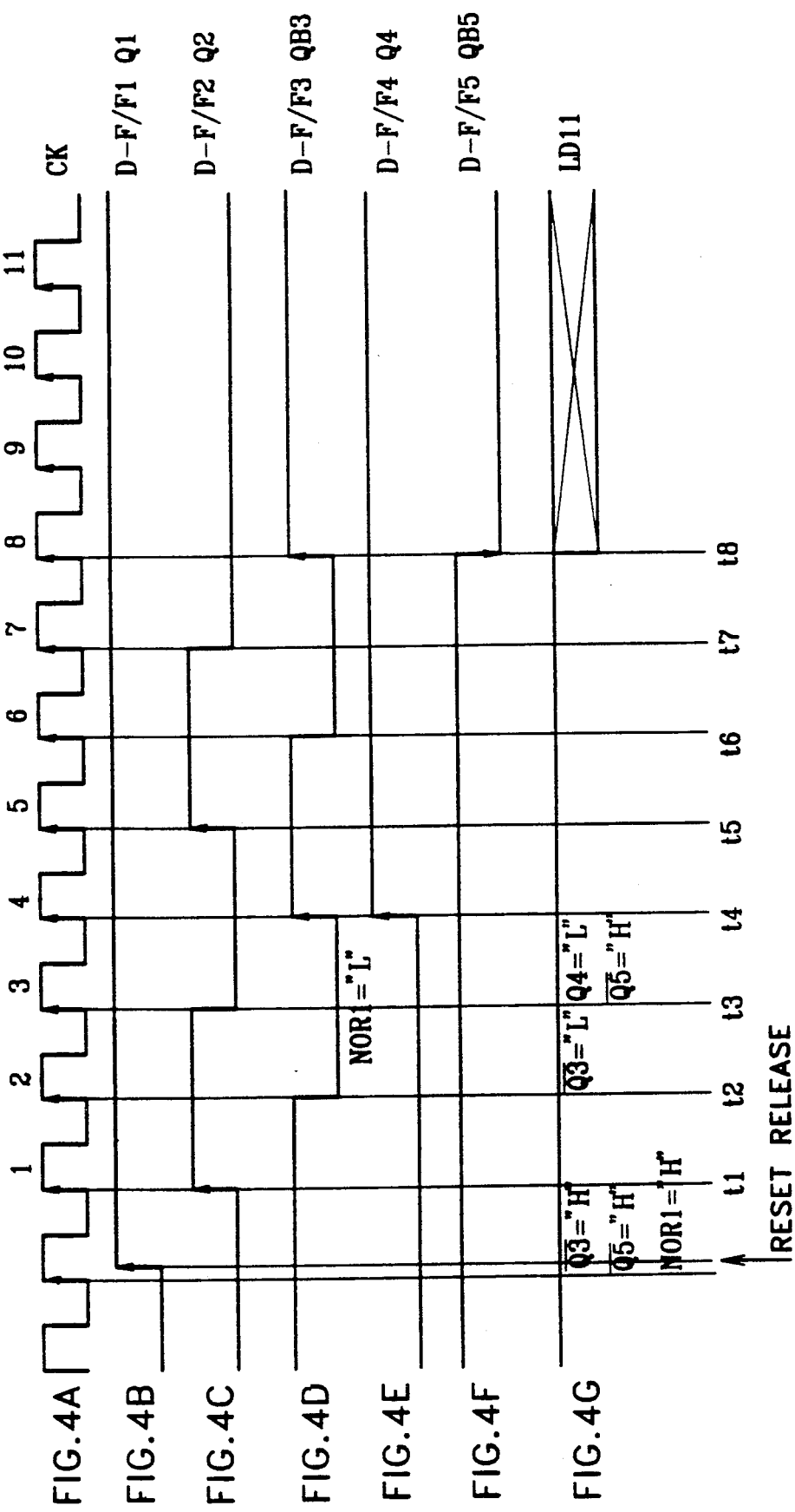

LOCK APPARATUS FOR DUAL PHASE LOCKED LOOP

BACKGROUND OF THE INVENTION

1. Field of the Invention

The present invention relates in general to a dual phase locked loop for locking, transmitting and receiving frequencies respectively to selected channel frequencies, and more particularly to a lock apparatus for a dual phase locked loop which is capable of detecting a locked state of the receiving frequency as well as a locked state of the transmitting frequency.

2. Description of the Prior Art

Generally, a phase locked loop, referred to hereinafter as a PLL, has been provided to lock transmitting and receiving frequencies respectively to selected channel frequencies. Early in the PLL, there has individually been provided transmitting and receiving PLLs which lock the transmitting and receiving frequencies, respectively. Progressively, a single PLL has recently been proposed to lock the transmitting and receiving frequencies with a single construction. This single PLL is called a dual PLL. The dual PLL has mostly been employed in such an equipment that has a plurality of transmitting and receiving channels and performs transmission and reception simultaneously at respective selected channel frequencies. Commonly, a radio telephone set is such an equipment.

The conventional dual PLL comprises lock apparatus for dividing transmitting and receiving frequencies according to selected channel frequencies, detecting phase differences between the divided frequencies and a reference frequency, generating, transmitting and receiving phase data based on the detected phase differences and detecting a locked state of the transmitting frequency, loop filters for filtering respectively the transmitting and receiving phase data from the lock apparatus, and voltage controlled oscillators for feeding back respectively oscillating frequencies controlled by the outputs from the loop filters, as the transmitting and receiving frequencies to the lock apparatus and outputting the locked transmitting and receiving frequencies externally, respectively.

Referring to FIG. 1, there is shown an example of the conventional lock apparatus of the dual PLL as mentioned above, in block form. As shown in this figure, the lock apparatus comprises a decoder 8 for decoding channel select data DATA inputted externally thereto synchronously with a clock pulse CLK, a transmitting and receiving channel data ROM 2 for selecting transmitting and receiving channels in accordance with the output data from the decoder 8, a receiving frequency counter 1 for counting a receiving frequency inputted through an input terminal INPUT1 according to the receiving channel data outputted from the transmitting and receiving channel data ROM 2, a transmitting frequency counter 3 for counting a transmitting frequency inputted through another input terminal INPUT2 according to the transmitting channel data outputted from the transmitting and receiving channel data ROM 2, a reference frequency counter 4 for counting an oscillating frequency from an external oscillator OSC and outputting the resulting reference frequency, a receiving phase difference detector 5 for comparing the counted receiving frequency from the receiving frequency counter 1 with the reference frequency from the reference frequency counter 4 to detect a phase difference therebetween and outputting phase data PD1 based on the detected phase difference, a transmitting phase difference detector 7 for comparing the counted transmitting frequency from the transmitting frequency counter 3 with the reference frequency from the reference frequency counter 4 to detect a phase difference therebetween and outputting phase data PD2 based on the detected phase difference, and a transmit lock detector 6 for checking another phase data from the transmitting phase difference detector 7 to detect phase locked state of the transmitting frequency to the reference frequency and outputting lock data LD1 externally in accordance with the detected phase locked state.

The operation of the conventional dual PLL lock apparatus with the above-mentioned construction will now be described.

First, upon receiving an external enable signal ENABLE operating the PLL, the decoder 8 decodes the inputted channel select data DATA synchronously with the clock signal CLK and applies the decoded data to the transmitting and receiving channel data ROM 2. In the transmitting and receiving channel data ROM 2, the transmitting and receiving channel data are generated corresponding to the decoded data from the decoder 8. The generated transmitting and receiving channel data are then applied respectively to the transmitting and receiving frequency counters 3 and 1. In the transmitting and receiving frequency counters 3 and 1, count values are determined respectively based on the applied transmitting and receiving channel data. These count values are determined such that the inputted transmitting and receiving frequencies are divided respectively to be equal to the reference frequency, in the transmitting and receiving frequency counters 3 and 1.

At this time, a transmitting frequency is applied through the input terminal INPUT2 to the transmitting frequency counter 3 and a receiving frequency is applied through the input terminal INPUT1 to the receiving frequency counter 1. The applied transmitting and receiving frequencies are counted based on the respective count values in the transmitting and receiving frequency counters 3 and 1, which then feed the counted transmitting and receiving frequencies respectively to the transmitting and receiving phase difference detectors 7 and 5. At this time, the oscillating frequency from the external oscillator OSC is applied to the reference frequency counter 4, which counts the applied oscillating frequency and outputs the resulting reference frequency to the transmitting and receiving phase difference detectors 7 and 5.

In the transmitting and receiving phase difference detectors 7 and 5, the counted transmitting and receiving frequencies from the transmitting and receiving frequency counters 3 and 1 are compared with the reference frequency from the reference frequency counter 4 and respective phase differences are detected according to the compared results. From the transmitting and receiving phase difference detectors 7 and 5, the transmitting and receiving phase data PD2 and PD1 based on the respective detected phase differences are outputted at a tri-state including high, low and floating states. Also, the transmitting phase difference detector 7 outputs a high or low locked state signal at its separate output terminal to the transmit lock detector 6. In accordance with the high or low locked state signal from the transmitting phase difference detector 7, the transmit lock detector 6 detects the locked state of the transmitting frequency.

Namely, if the phases of the counted transmitting and receiving frequencies from the transmitting and receiving frequency counters 3 and 1 are detected as being equal respectively to the phase of the reference frequency from the reference frequency counter 4 as a result of comparison of the counted transmitting and receiving frequencies with the reference frequency in the transmitting and receiving phase difference detectors 7 and 5, the transmitting and receiving phase data PD2 and PD1 are outputted at high impedance states, respectively, from the transmitting and receiving phase difference detectors 7 and 5. The high or low locked state signal is also outputted at the separate output terminal of the transmitting phase difference detector 7 to the transmit lock detector 6. The transmit lock detector 6 checks the locked state of the transmitting phase difference detector 7 on the basis of the high or low locked state signal. If locked state, the transmit lock detector 6 outputs the lock data LD1 of high impedance externally output of the PLL to notify that the transmitting frequency has been locked.

On the other hand, the transmitting and receiving phase data PD2 and PD1 are applied through corresponding loop filters (not shown) to corresponding voltage controlled oscillators (not shown), which then feed back respectively oscillating frequencies controlled based on the transmitting and receiving phase data PD2 and PD1, as the transmitting and receiving frequencies to the input terminals INPUT2 and INPUT1. The operation, hereinbefore described, is repeatedly performed in this manner.

In the outside of the PLL, a system control unit such as a microcomputer receives the transmit lock data LD1 from the transmit lock detector 6 and recognizes, from the received transmit lock data LD1, that the transmitting frequency has been locked. If recognized, the system control unit performs the accompanying communication control and stops the operation of the PLL lock apparatus for preventing power consumption. Thereafter, upon channel change or power on/off, the system control unit makes the PLL enable, so as to lock the transmitting and receiving frequencies in the above-mentioned manner.

However, the convention lock apparatus for the PLL has a disadvantage, in that it is constructed only to detect the locked state of the transmitting frequency. That is, since only the locked state of the transmitting frequency is detected, the locked state of the receiving frequency is determined at a guess on the basis of the point of time at which the transmitting frequency is locked. For this reason, it takes very long time to lock the receiving frequency. This acts as a delay element on a system requiring a fast response.

SUMMARY OF THE INVENTION

Therefore, the present invention has been made in view of the above problem, and it is an object of the present invention to provide lock apparatus for a dual PLL for accurately detecting points of time at which transmitting and receiving frequencies are locked.

It is another object of the present invention to provide lock apparatus for a dual PLL for shorting time to be taken to lock a receiving frequency, so as to make fast response possible.

In accordance with the present invention, the above objects can be accomplished by a provision of lock apparatus for a dual PLL comprising a decoder being operated by an external enable signal to decode channel select data inputted externally thereto, synchronously with a clock pulse; a transmitting and receiving channel data generator in accordance with transmitting and receiving frequency select data from the decoder; transmitting and receiving frequency counter for determining count values respectively according to the transmitting and receiving channel data from the data generator and counting transmitting and receiving frequencies inputted through respective input terminals, respectively, based on the determined count values; transmitting and receiving phase difference detector for comparing the counted transmitting and receiving frequencies from the transmitting and receiving frequency counter with a reference frequency from a reference frequency counter, respectively, to detect phase differences therebetween and outputting phase data and locked state signals, respectively, based on the detected phase differences; and transmit and receive lock detecter for detecting phase locked states of the transmitting and receiving frequencies, respectively, in response to the locked state signals from said transmitting and receiving phase difference detector and outputting lock data externally, respectively, in accordance with the detected phase locked states.

The receive lock detector comprises a reset signal generator for generating a reset signal in response to the receive locked state signal from the receiving phase difference detector; frequency-divider for dividing a first predetermined frequency from the reference frequency counter by a given ratio in response to the reset signal from the reset signal generator; and a receive lock data output unit for outputting the receive lock data in response to an output signal from the frequency-divider.

BRIEF DESCRIPTION OF THE DRAWINGS

The above and other objects, features and advantages of the present invention will be more clearly understood from the following detailed description taken in conjunction with the accompanying drawings, in which:

FIGS. 4A through 4G are waveform diagrams of signals from respective components in the receive lock detector of FIG. 3 in accordance with the present invention, wherein:

FIG. 4A is a waveform diagram of a clock signal based on a reference frequency (2.5 KHz);

FIG. 4B is a waveform diagram of an output signal from a reset signal generating circuit;

FIG. 4C is a waveform diagram of an output signal from a second flip-flop in a frequency-dividing circuit;

FIG. 4D is a waveform diagram of an output signal from a third flip-flop in the frequency-dividing circuit;

FIG. 4E is a waveform diagram of an output signal from a fourth flip-flop in the frequency-dividing circuit;

FIG. 4F is a waveform diagram of an output signal from a fifth flip-flop in the frequency-dividing circuit; and FIG. 4G is a waveform diagram of an output signal from a receive lock data output circuit.

DESCRIPTION OF PREFERRED EMBODIMENTS

Figure 1:
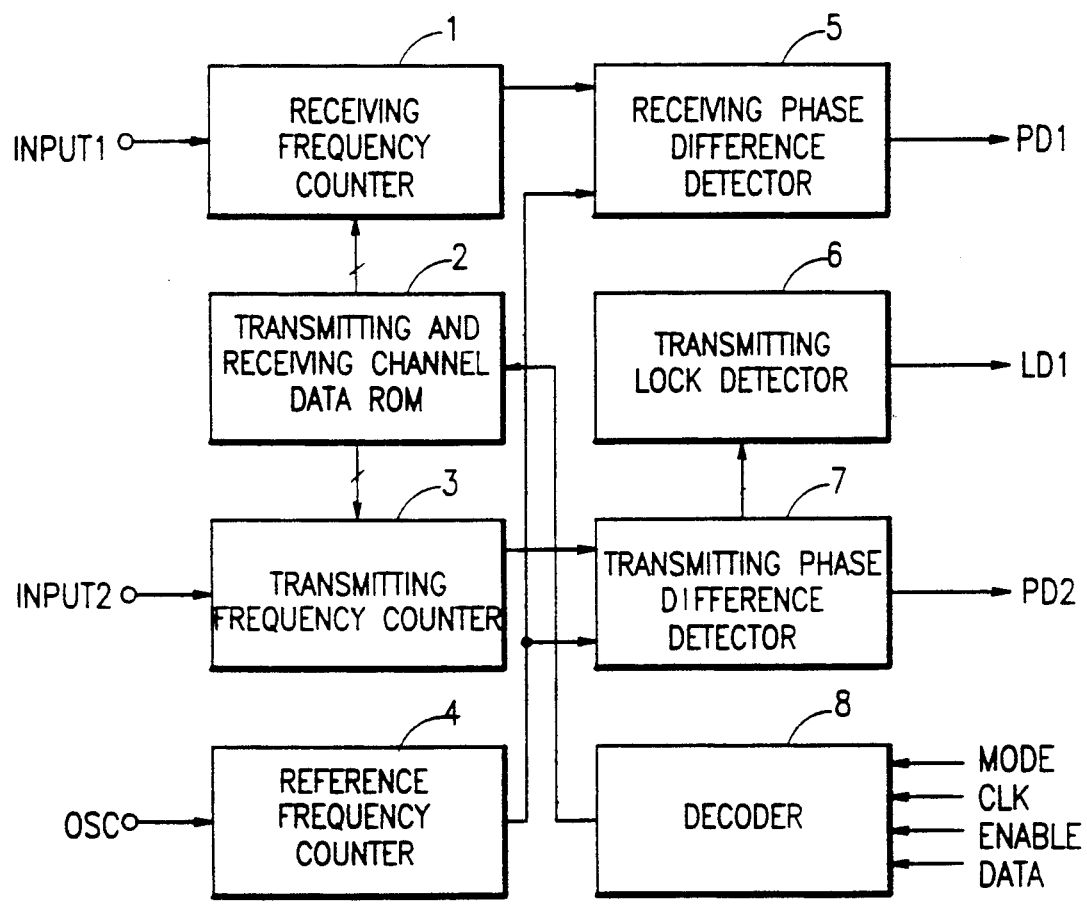
FIG. 1 is a block diagram of conventional lock apparatus for a dual PLL.
Figure 2:
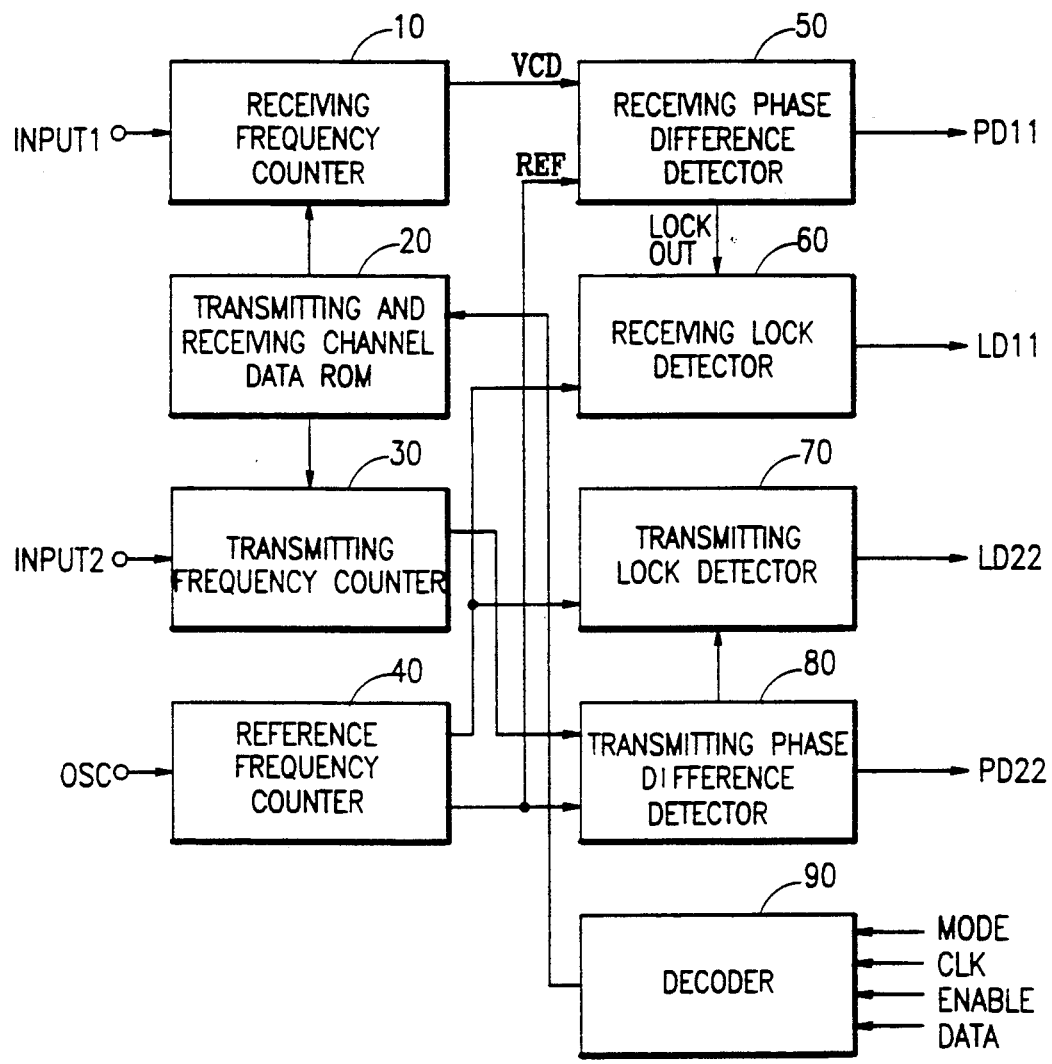
FIG. 2 is a block diagram of lock apparatus for a dual PLL in accordance with the present invention.

Referring to FIG. 2, there is shown a lock apparatus for a dual PLL in accordance with the present invention, in block form. As shown in this figure, the lock apparatus comprises a decoder 90 being operated by an external enable signal ENABLE to decode channel select data DATA inputted externally thereto synchronously with a clock pulse CLK, a transmitting and receiving channel data ROM 20 for generating transmitting and receiving channel data in accordance with transmitting and receiving frequency select data from the decoder 90, transmitting and receiving frequency counters 30 and 10 for determining count values respectively according to the transmitting and receiving channel data from the transmitting and receiving channel data ROM 20 and counting transmitting and receiving frequencies inputted through input terminals INPUT2 and INPUT 1, respectively, based on the determined count values, a reference frequency counter 40 for counting an oscillating frequency from an external oscillator OSC and outputting the resulting reference frequency, transmitting and receiving phase difference detectors 70 and 50 for comparing the counted transmitting and receiving frequencies from the transmitting and receiving frequency counters 30 and 10 with the reference frequency from the reference frequency counter 40, respectively, to detect phase differences therebetween and outputting phase data PD22 and PD11 and locked state signals, respectively, based on the detected phase differences, and transmit and receive lock detectors 80 and 60 for detecting phase locked states of the transmitting and receiving frequencies, respectively, in response to the locked state signals from the transmitting and receiving phase difference detectors 70 and 50 and outputting lock data LD22 and LD11 externally, respectively, in accordance with the detected phase locked states.

Figure 3:
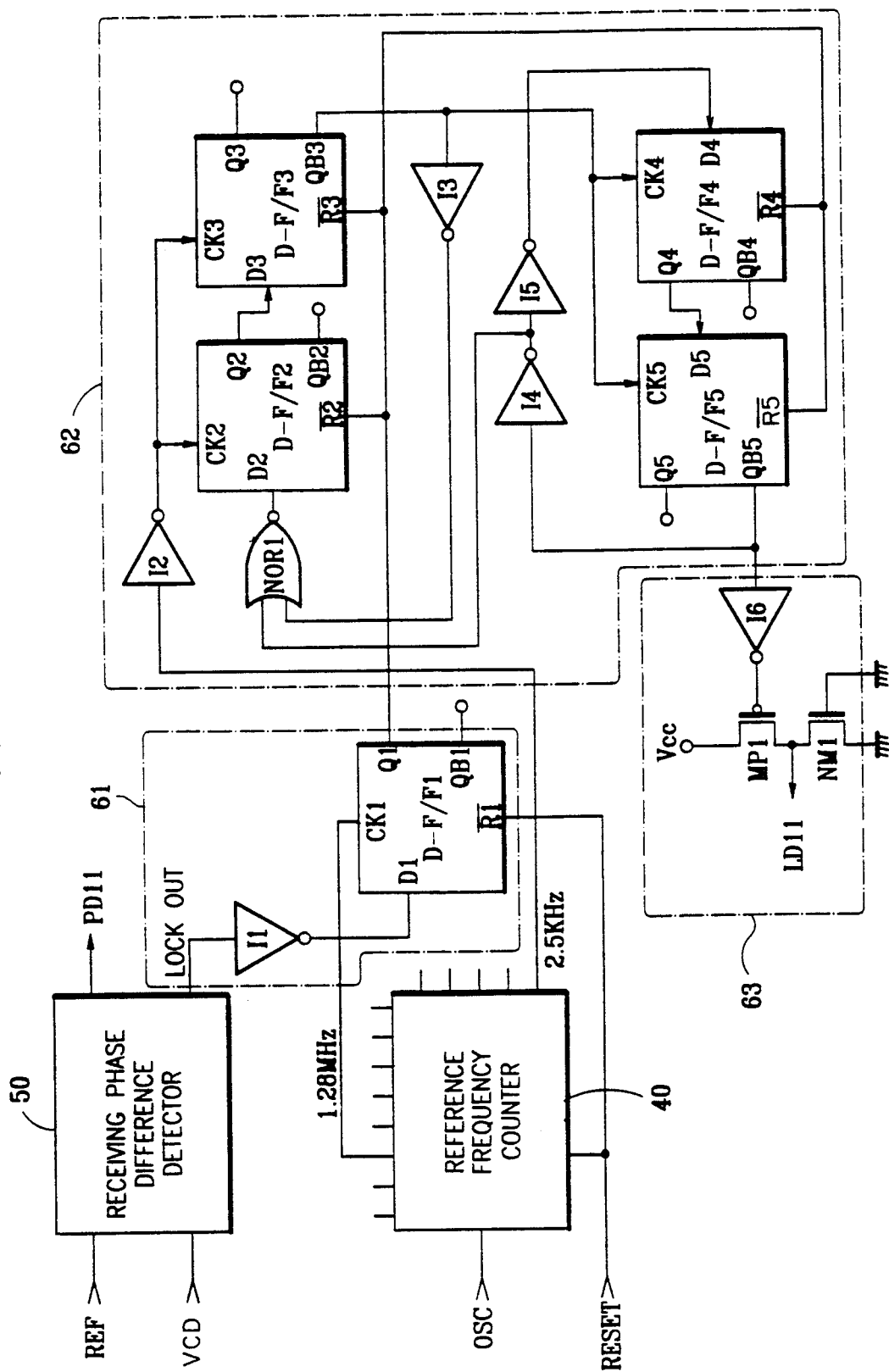
FIG. 3 is a detailed circuit diagram of a receive lock detector in the lock apparatus of FIG. 2 in accordance with the present invention.

Referring to FIG. 3, the receive lock detector 60 comprises a reset signal generating circuit 61 for generating a reset signal in response to the receive locked state signal from the receiving phase difference detector 50, a frequency-dividing circuit 62 for dividing a predetermined frequency from the reference frequency counter 40 by a given ratio in response to the reset signal from the reset signal generating circuit 61, and a receive lock data output circuit 63 for outputting the receive lock data LD11 in response to an output signal from the frequency-dividing circuit 62.

The reset signal generating circuit 61 includes a first inverter gate I1 for invert-buffering the receive locked state signal from the receiving phase difference detector 50, and a first flip-flop D-F/F1 for receiving an output signal from the first inverter gate I1 at its data input terminal D1, an external reset signal RESET at its reset terminal R1 and a predetermined frequency (1.28 MHz) signal from the reference frequency counter 40 at its clock terminal CK1 and outputting the reset signal in response to the output signal from the first inverter gate I1 and synchronously with the predetermined frequency (1.28 MHz) signal.

The frequency-dividing circuit 62 includes a second inverter gate I2 for inverting the predetermined frequency (2.5 KHz) signal from the reference frequency counter 40, second and third master/slave flip-flops D-F/F2 and D-F/F3 for receiving the reset signal from the reset signal generating circuit 61 at their reset terminals R2 and R3 and an output signal from the second inverter gate I2 at their clock terminals CK2 and CK3 and, upon release of reset state, frequency-dividing the output signal from the second inverter gate I2 by two, delaying the 2-frequency-divided signal by one clock and outputting the one clock delayed pulse signal, fourth and fifth master/slave flip-flops D-F/F4 and D-F/F5 for receiving the reset signal from the reset signal generating circuit 61 at their reset terminals R4 and R5 and an output pulse signal from an inverting output terminal $Q_B3$ of the third flip-flop D-F/F3 at their clock terminals CK4 and CK5 and, upon release of reset state, frequency-dividing the output pulse signal from the third flip-flop D-F/F3 by two, delaying the 2-frequency-divided signal by one clock and outputting the one clock delayed pulse signal, a third inverter gate I3 for inverting the output pulse signal from an inverting output terminal $Q_B3$ of the third flip-flop D-F/F3, a fourth inverter gate I4 for inverting an output pulse signal from an inverting output terminal $Q_B5$ of the fifth flip-flop D-F/F35, a fifth inverter gate I5 for inverting an output signal from the fourth inverter gate I4 and feeding back the inverted signal to a data input terminal D4 of the fourth flip-flop D-F/F4, and a NOR gate NOR1 for NORing the output signals from the third and fourth inverter gates I3 and I4 and feeding back the NORed signal to a data input terminal D2 of the second flip-flop D-F/F2.

The receive lock data output circuit 63 includes a sixth inverter gate I6 for invert-buffering the output signal from the frequency-dividing circuit 62, a PMOS transistor MP1 having its gate terminal connected to an output terminal of the sixth inverter gate I6 and its source terminal connected to a power source Vcc terminal, and a NMOS transistor MN1 having its gate and source terminals connected to ground and its drain terminal connected to a drain terminal of the PMOS transistor MP1, both the drain terminals forming a receive lock data LD11 output terminal at a junction therebetween.

Now, the operation of the dual PLL lock apparatus with the above-mentioned construction in accordance with the present invention will be described in detail.

First, upon receiving an external enable signal ENABLE operating the PLL, the decoder 90 decodes the inputted channel select data DATA synchronously with the clock signal CLK and applies the decoded data to the transmitting and receiving channel data ROM 20. In the transmitting and receiving channel data ROM 20, the transmitting and receiving channel data are generated corresponding to the decoded data from the decoder 90. The generated transmitting and receiving channel data are then applied respectively to the transmitting and receiving frequency counters 30 and 10. In the transmitting and receiving frequency counters 30 and 10, count values are determined respectively based on the applied transmitting and receiving channel data. These count values are determined such that the inputted transmitting and receiving frequencies are divided respectively to be equal to the reference frequency, in the transmitting and receiving frequency counters 30 and 10.

At this time, a transmitting frequency is applied through the input terminal INPUT2 to the transmitting frequency counter 30 and a receiving frequency is applied through the input terminal INPUT1 to the receiving frequency counter 10. The applied transmitting and receiving frequencies are counted based on the respective count values in the transmitting and receiving frequency counters 30 and 10, which then feed the counted transmitting and receiving frequencies respectively to the transmitting and receiving phase difference detectors 70 and 50. At this time, the oscillating frequency from the external oscillator OSC is applied to the reference frequency counter 40, which counts the applied oscillating frequency and outputs the resulting reference frequency to the transmitting and receiving phase difference detectors 70 and 50.

In the transmitting and receiving phase difference detectors 70 and 50, the counted transmitting and receiving frequencies from the transmitting and receiving frequency counters 30 and 10 are compared with the reference frequency from the reference frequency counter 40 and respective phase differences are detected according to the compared results. From the transmitting and receiving phase difference detectors 70 and 50, the transmitting and receiving phase data PD22 and PD11 based on the respective detected phase differences are outputted at a tri-state including high, low and floating states. Also, the transmitting and receiving phase difference detectors 70 and 50 output high or low locked state signals at their separate output terminals, respectively, to the transmit and receive lock detectors 80 and 60. In accordance with the high or low locked state signals from the transmitting and receiving phase difference detectors 70 and 50, the transmit and receive lock detectors 80 and 60 detect the locked states of the transmitting and receiving frequencies, respectively.

Namely, if the phases of the counted transmitting and receiving frequencies from the transmitting and receiving frequency counters 30 and 10 are detected as being equal respectively to the phase of the reference frequency from the reference frequency counter 40 as a result of comparison of the counted transmitting and receiving frequencies with the reference frequency in the transmitting and receiving phase difference detectors 70 and 50, the transmitting and receiving phase data PD22 and PD11 are outputted at high impedance states, respectively, from the transmitting and receiving phase difference detectors 70 and 50. The high or low locked state signals are also outputted at the separate output terminals of the transmitting and receiving phase difference detectors 70 and 50, respectively, to the transmit and receive lock detectors 80 and 60. The transmit and receive lock detectors 80 and 60 check the locked states of the transmitting and receiving phase difference detectors 70 and 50, respectively, on the basis of the high or low locked state signals. If locked states, the transmit and receive lock detectors 80 and 60 output the lock data LD22 and LD11 of high impedances externally output of the PLL to notify that the transmitting and receiving frequencies have been locked.

In the outside of the PLL, a system control unit such as a microcomputer receives the transmit and receive lock data LD22 and LD11 from the transmit and receive lock detectors 80 and 60 and recognizes, from the received transmit and receive lock data LD22 and LD11, that the transmitting and receiving frequencies have been locked. If recognized, the system control unit performs the accompanying communication control and stops the operation of the PLL lock apparatus for preventing power consumption. Thereafter, upon channel change or power on/off, the system control unit makes the PLL enable, so as to lock the transmitting and receiving frequencies in the above-mentioned manner.

On the other hand, the transmitting and receiving phase data PD22 and PD11 are applied through corresponding loop filters (not shown) to corresponding voltage controlled oscillators (not shown), which then feed back respectively oscillating frequencies controlled based on the transmitting and receiving phase data PD22 and PD11, as the transmitting and receiving frequencies to the input terminals INPUT2 and INPUT1. The operation, hereinbefore described, is repeatedly performed in this manner.

The operation of the receive lock detector 60 with the construction in FIG. 3 will now be mentioned in detail with reference to FIGS. 4A through 4G.

If a PLL reset signal RESET of high level is applied from an external system control unit, the reset states of the reference frequency counter 40 and the first flip-flop D-F/F1 in the reset signal generating circuit 61 are released. Upon release of the reset state, the 1.28 MHz frequency signal from the reference frequency counter 40 is applied to the clock terminal CK1 of the first flip-flop D-F/F1 and the 2.5 KHz frequency signal from the reference frequency counter 40 is inverted by the second inverter gate I2 in the frequency-dividing circuit 62 and applied to the clock terminals CK2 and CK3 of the second and third flip-flops D-F/F2 and D-F/F3 in the frequency-dividing circuit 62.

At this time, if the locked state signal LOCK OUT of high level is applied from the receiving phase difference detector 50, the high locked state signal LOCK OUT is inverted by the first inverter I1 in the reset signal generating circuit 61 and the resulting low signal is loaded to the input terminal D1 of the first flip-flop D-F/F1 in the reset signal generating circuit 61. In response to the loaded low signal to the input terminal D1 and synchronously with the 1.28 MHz frequency signal, the first flip-flop D-F/F1 outputs a low signal at its output terminal Q1. This low output signal is the reset signal from the reset signal generating circuit 61. The low output signal from the first flip-flop D-F/F1 is applied to the reset terminals R2–R5 of the second through fifth flip-flops D-F/F2 to D-F/F5 in the frequency-dividing circuit 62, thereby causing the second through fifth flip-flops D-F/F2 to D-F/F5 to become resetted.

As a result, a high signal is outputted from the inverting output terminal $Q_B5$ of the fifth flip-flop D-F/F5. In the receive lock data output circuit 63, the high output signal from the fifth flip-flop D-F/F5 in the frequency-dividing circuit 62 is inverted by the sixth inverter gate I6 into a low signal enabling the PMOS transistor MP1 to be turned on. The turning-on of the PMOS transistor MP1 results in output of the receive lock data LD11 of high level at the receive lock data output terminal in the receive lock data output circuit 63. The high receive lock data LD11 indicates that the receiving frequency has not been locked yet.

Thereafter, if the receiving phase difference detector 50 outputs the locked state signal LOCK OUT of low level indicating that the receiving frequency has been locked, the low locked state signal LOCK OUT is inverted by the first inverter I1 in the reset signal generating circuit 61 and the resulting high signal is loaded to the input terminal D1 of the first flip-flop D-F/F1 in the reset signal generating circuit 61. In response to the loaded high signal to the input terminal D1 and synchronously with the 1.28 MHz frequency signal, the first flip-flop D-F/F1 outputs a high signal at its output terminal Q1. Namely, if the locked state signal LOCK OUT regarding the receiving frequency is outputted as low level from the receiving phase difference detector 50, a high signal is outputted, at timing as shown in FIG. 4B, from the first flip-flop D-F/F1 in the reset signal generating circuit 61. The high output signal from the first flip-flop D-F/F1 is applied to the reset terminals R2-R5 of the second through fifth flip-flops D-F/F2 to D-F/F5 in the frequency-dividing circuit 62, thereby causing the second through fifth flip-flops D-F/F2 to D-F/F5 to be released out of the reset state.

On the other hand, another frequency (2.5 KHz) signal is generated from the reference frequency counter 40. This 2.5 KHz frequency signal is inverted by the second inverter gate I2 in the frequency-dividing circuit 62 and the inverted frequency signal is applied to the clock terminals CK2 and CK3 of the second and third flip-flops D-F/F2 and D-F/F3 in the frequency-dividing circuit 62, as a clock signal CK as shown in FIG. 4A.

If the reset release signal is outputted from the reset signal generating circuit 61 at the timing as shown in FIG. 4B, the second flip-flop D-F/F2 in the frequency-dividing circuit 62 divides the applied clock signal CK as shown in FIG. 4A by two and then outputs the 2-frequency-divided signal as shown in FIG. 4C. In other words, upon release of the reset state of the frequency-dividing circuit 62, high signals are outputted respectively from the inverting output terminals $Q_B3$ and $Q_B5$ of the third and fifth flip-flops D-F/F3 and D-F/F5. These high signals are inverted respectively by the third and fourth inverter gates I3 and I4 into low signals, which are then applied to the NOR gate NOR1 which NORs the applied low signals. As a result, a high signal from the NOR gate NOR1 is loaded to the data input terminal D2 of the second flip-flop D-F/F2.

Accordingly, the output signal from the output terminal Q2 of the second flip-flop D-F/F2 rises to high level at the first rising edge t1 of the clock signal CK as shown in FIG. 4A inputted after release of the reset state. At this time, the output signal from the inverting output terminal $Q_B3$ of the third flip-flop D-F/F3 is maintained at high level.

Thereafter, the output signal from the inverting output terminal $Q_B3$ of the third flip-flop D-F/F3 falls to low level at the second rising edge t2 of the clock signal CK. This low output signal from the inverting output terminal $Q_B3$ of the third flip-flop D-F/F3 is fed back to the data input terminal D2 of the second flip-flop D-F/F2 through the third inverter gate I3 and then through the NOR gate NOR1. As a result, the output signal from the output terminal Q2 of the second flip-flop D-F/F2 falls to low level at the third rising edge t3 of the clock signal CK and the output signal from the inverting output terminal $Q_B3$ of the third flip-flop D-F/F3 rises to high level at the fourth rising edge t4 of the clock signal CK.

Accordingly, the second flip-flop D-F/F2 divides the clock signal CK by two and outputs the 2-frequency-divided pulse signal as shown in FIG. 4C and the third flip-flop D-F/F3 delays the 2-frequency-divided pulse signal from the second flip-flop D-F/F2 by one clock, inverts the one clock delayed pulse signal and outputs the inverted one clock delayed pulse signal as shown in FIG. 4D.

On the other hand, the fourth and fifth flip-flops D-F/F4 and D-F/F5 input the output signal from the inverting output terminal $Q_B3$ of the third flip-flop D-F/F3 as their clock signals and act as a master and a slave, respectively. Namely, the output signal from the non-inverting output terminal Q4 of the fourth flip-flop D-F/F4 rises to high level at the first rising edge t4 of the output signal from the inverting output terminal $Q_B3$ of the third flip-flop D-F/F3 as shown in FIG. 4D and the output signal from the inverting output terminal $Q_B5$ of the fifth flip-flop D-F/F5 falls to low level at the second rising edge t8 of the output signal from the inverting output terminal $Q_B3$ of the third flip-flop D-F/F3 as shown in FIG. 4D.

Thereafter, since the low output signal from the inverting output terminal $Q_B5$ of the fifth flip-flop D-F/F5 is fed back to the data input terminal D2 of the second flip-flop D-F/F2, the output signal from the non-inverting output terminal Q2 of the second flip-flop D-F/F2 is fixed at low level and the output signal from the inverting output terminal $Q_B3$ of the third flip-flop D-F/F3 is fixed at high level. As a result, the fourth and fifth flip-flops D-F/F4 and D-F/F5 input the clock signal with no edge, resulting in fixing of levels of the output signals therefrom. In other words, outputted from the frequency-dividing circuit 62 are a control signal of low level as shown in FIG. 4F at the eighth rising edge point of time of the clock signal CK, after release of the reset state, into which the 2.5 KHz frequency signal from the reference frequency counter 40 is inverted by the second inverter gate I2. This low control signal from the frequency-dividing circuit 62 is maintained fixed until the reset signal from the reset signal generating circuit 61 is active.

Upon receiving the low control signal from the inverting output terminal $Q_B5$ of the fifth flip-flop D-F/F5 in the frequency-dividing circuit 62 as shown in FIG. 4F, the receive lock data output circuit 63 inverts the received low control signal by means of the sixth inverter gate I6 thereof into a high signal enabling the PMOS transistor MP1 thereof to be turned off. The turning-off of the PMOS transistor MP1 results in output of the receive lock data LD11 of high impedance as shown in FIG. 4G at the receive lock data output terminal in the receive lock data output circuit 63. The high impedance receive lock data LD11 indicates that the receiving frequency has been locked.

As mentioned above, the receive lock detector 60 receive the receive locked state signal from the receiving phase difference detector 50 and outputs the high impedance receive lock data LD11 indicative of the locked state of the receiving frequency, only in the case where the receive locked state signal lasts for a predetermined period of time (from release of the reset state till the eighth edge t8 of the clock signal CK).

As hereinbefore described, according to the present invention, there is provided the dual PLL lock apparatus with the receive lock detector for detecting the phase locked state of the receiving frequency in response to the locked state signal from the receiving phase difference detector. Therefore, the points of time at which the transmitting and receiving frequencies are locked can accurately be detected upon power on/off of the dual PLL or upon channel change. This results in prevention of time waste in detecting the receive locked state. Moreover, the receive lock data can be outputted from the receive lock detector only in the case where the receive locked state lasts for a predetermined period of time. This provides assurance of stable receive lock-detection.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A lock apparatus for a dual phase locked loop (PLL) comprising:

decoding means being operated by an external enable signal to decode channel select data inputted externally thereto, synchronously with a clock pulse;

means for generating, transmitting and receiving channel data in accordance with transmitting and receiving frequency select data from said decoding means;

transmitting and receiving frequency counting means for determining count values respectively according to the transmitting and receiving channel data from said channel data generating, transmitting and receiving means and for counting, transmitting and receiving frequencies inputted through respective input terminals, respectively, based on the determined count values;

transmitting and receiving phase difference detecting means for comparing the counted transmitting and receiving frequencies from said transmitting and receiving frequency counting means with a reference frequency from a reference frequency counter, respectively, to detect phase differences therebetween and for outputting phase data and locked state signals, respectively, based on the detected phase differences; and transmit and receive lock detecting means for detecting phase locked states of the transmitting and receiving frequencies, respectively, in response to the locked state signals from said transmitting and receiving phase difference detecting means and for outputting lock data externally, respectively, in accordance with the detected phase locked states, wherein said receive lock detecting means comprises reset signal generating means for generating a reset signal in response to the receive locked state signal from said receiving phase difference detecting means, frequency-dividing means for dividing a first predetermined frequency from said reference frequency counter by a given ratio in response to the reset signal from said reset signal generating means, and a receive lock data output means for outputting the receive lock data in response to an output signal from said frequency-dividing means.

2. The lock apparatus for a dual PLL as set forth in claim 1, wherein said reset signal generating means includes:

a first inverter gate for invert-buffering the receive locked state signal from said receiving phase difference detecting means; and a first flip-flop for receiving an output signal from said first inverter gate at its data input terminal, an external reset signal at its reset terminal and a second predetermined frequency signal from said reference frequency counter at its clock terminal for outputting the reset signal in response to the output signal from said first inverter gate and synchronously with the second predetermined frequency signal.

3. The lock apparatus for a dual PLL as set forth in claim 1, wherein said frequency-dividing means includes:

a second inverter gate for inverting the first predetermined frequency signal from said reference frequency counter;

second and third flip-flops in a master-slave interconnection for receiving the reset signal from said reset signal generating means at their reset terminals and a first output signal from said second inverter gate at their clock terminals, said second and third flip-flops, upon release of reset state, frequency-dividing the output signal from said second inverter gate by two to generate a first frequency-divided signal, delaying the first frequency divided signal by one clock cycle and outputting a first pulse signal delayed by one clock cycle;

fourth and fifth flip-flops in a master-slave interconnection for receiving the reset signal from said reset signal generating means at their reset terminals and the first pulse signal delayed by one clock cycle from an inverting output terminal of said third flip-flop at their clock terminals, said fourth and fifth flip-flops, upon release of reset state, frequency-dividing the first pulse signal from said third flip-flop by two to generate a second frequency-divided signal, delaying the second frequency-divided signal by one clock cycle and outputting a second pulse signal delayed by one clock cycle as the output signal;

a third inverter gate for inverting the first pulse signal from said inverting output terminal of said third flip-flop to output a second output signal;

a fourth inverter gate for inverting the second pulse signal from an inverting output terminal of said fifth flip-flop to output a third output signal;

a fifth inverter gate for inverting the third output signal from said fourth inverter gate and feeding back the inverted signal to a data input terminal of said fourth flip-flop; and a NOR gate for NORing the second and third output signals from said third and fourth inverter gates and feeding back the NORed signal to a data input terminal of said second flip-flop.

4. The lock apparatus for a dual PLL as set forth in claim 1, wherein said receive lock data output means outputs the receive lock data of high impedance in response to the output signal from said frequency-dividing means when the locked state of the receiving frequency is detected.

5. The lock apparatus for a dual PLL as set forth in claim 4, wherein said receive lock data output means includes:

a sixth inverter gate for invert-buffering the output signal from said frequency-dividing means;

a P-type Metal-Oxide-Semiconductor (PMOS) transistor having its gate terminal connected to an output terminal of said sixth inverter gate and its source terminal connected to a power source terminal; and a N-type Metal-Oxide-Semiconductor (NMOS) transistor having its gate and source terminals connected to ground and its drain terminal connected to a drain terminal of said PMOS transistor, both the drain terminals forming a receive lock data output terminal at a junction therebetween.

* * * * *